(12) United States Patent
Fang et al.

(10) Patent No.: US 11,861,088 B2
(45) Date of Patent: Jan. 2, 2024

(54) DISPLAY PANEL AND DISPLAY DEVICE

(71) Applicant: Wuhan China Star Optoelectronics Semiconductor Display Technology Co., Ltd., Wuhan (CN)

(72) Inventors: Liang Fang, Wuhan (CN); Ding Ding, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/284,450

(22) PCT Filed: Dec. 25, 2020

(86) PCT No.: PCT/CN2020/139583
§ 371 (c)(1),
(2) Date: Apr. 10, 2021

(87) PCT Pub. No.: WO2022/126713
PCT Pub. Date: Jun. 23, 2022

(65) Prior Publication Data
US 2023/0325015 A1 Oct. 12, 2023

(30) Foreign Application Priority Data
Dec. 18, 2020 (CN) .......................... 202011506579.0

(51) Int. Cl.
*G06F 3/041* (2006.01)
*H10K 59/40* (2023.01)
*G06F 3/044* (2006.01)

(52) U.S. Cl.
CPC ............ *G06F 3/0412* (2013.01); *G06F 3/044* (2013.01); *G06F 3/0416* (2013.01); *H10K 59/40* (2023.02)

(58) Field of Classification Search
CPC ....................................................... H10K 59/40
USPC .................................................... 345/174, 76
See application file for complete search history.

(56) References Cited

U.S. PATENT DOCUMENTS

| 2017/0068385 | A1* | 3/2017 | Lu | ............................. G09G 3/20 |
| 2018/0143717 | A1* | 5/2018 | An | ......................... G06F 3/0412 |
| 2018/0335877 | A1* | 11/2018 | Zhang | .................. G06F 3/04164 |
| 2019/0157356 | A1* | 5/2019 | Li | ........................... H10K 59/40 |

\* cited by examiner

*Primary Examiner* — Jimmy H Nguyen
(74) *Attorney, Agent, or Firm* — Nathan & Associates; Menachem Nathan

(57) ABSTRACT

The disclosure provides a display device and a display panel. The display panel includes an array substrate, a driving circuit, a touch electrode layer. Each of the touch electrode blocks includes a touch electrode and a compensation electrode which are disposed to be insulated from each other. The touch signal line and the compensation electrode are disposed on a same layer. The orthographic projections of the touch electrode and the compensation electrode projected on the array substrate have an overlapping area, and the overlapping area on the touch electrode block close to the driving circuit is larger than the overlapping area on the touch electrode block away from the driving circuit.

20 Claims, 3 Drawing Sheets

DISPLAY PANEL AND DISPLAY DEVICE

FIELD OF INVENTION

The present disclosure relates to the field of a display component technology, and more particularly, to a display panel and a display device.

BACKGROUND OF INVENTION

Display devices mainly include liquid crystal displays (LCD), plasma display panels (PDP), organic light-emitting diodes (OLED) and active-matrix organic light-emitting diodes (AMOLED), and the display devices are widely applied in many products, such as cars, mobile phones, tablets, computers and TVs.

In general, the touch function has become one of the standard configurations of the display devices, in which capacitive touch screens are widely used. The basic principle is to use tools, such as fingers or styluses, to generate capacitance on the touch screen, and use the electrical signal formed by the variation of the capacitance before and after touching to determine whether the panel is touched and confirm the coordinates of touching. The existing self-capacitance touch design is to divide the common electrode layer of the panel into several blocks. During display, the common electrode signal and the scanning line signal for the touch are switched continuously, thereby realizing the integration of display and touch functions.

However, since the common electrode layer is divided into hundreds of blocks in the same size, and each block is connected to the touch signal line separately. During scanning for the touch, the display panel is affected by resistance and capacitance loading (RC loading). Since the touch signal line of the far-end block is long and the impedance is large, the loading of the far-end touch signal line is large. Since the touch signal line of the near-end block is short and the impedance is small, the loading of the near-end touch signal line is small. In other words, the power of the touch signal gradually decreases from the near end to the far end. Under the influence of certain processes and screen sizes, the loading difference between the far end and the near end is large, especially in the panel with relatively-high loading, the difference of the touch signal between the far end and the near end is even more than 20%. When the driving capability fails to make up for the difference, the product quality may be poor. For example, the flicker phenomenon may occur.

SUMMARY OF INVENTION

Technical Problems

The embodiment of the present disclosure provides a display panel and a display device to solve the problem of poor display of the display panel.

Technical Solutions

The present disclosure provides a display panel which includes: an array substrate provided with a display area and a non-display area; a driving circuit disposed on the array substrate and located in the non-display area; a touch electrode layer including a plurality of touch electrode blocks disposed in an array on the array substrate and located in the display area, wherein each of the touch electrode blocks includes a touch electrode and a compensation electrode which are disposed to be insulated from each other, and the touch signal line and the compensation electrode are disposed on a same layer; wherein the orthographic projections of the touch electrode and the compensation electrode projected on the array substrate have an overlapping area, and the overlapping area of the orthographic projections of the touch electrode and the compensation electrode projected on the array substrate decreases along a direction from a side close to the driving circuit to a side away from the driving circuit; a plurality of touch signal lines, wherein each of the touch signal lines is connected to the driving circuit and a corresponding touch electrode block.

The present disclosure further provides a display panel which includes: an array substrate provided with a display area and a non-display area; a driving circuit disposed on the array substrate and located in the non-display area; a touch electrode layer including a plurality of touch electrode blocks disposed in an array on the array substrate and located in the display area, wherein each of the touch electrode blocks includes a touch electrode and a compensation electrode which are disposed to be insulated from each other, the orthographic projections of the touch electrode and the compensation electrode projected on the array substrate have an overlapping area, and the overlapping area on the touch electrode block close to the driving circuit is larger than the overlapping area on the touch electrode block away from the driving circuit; a plurality of touch signal lines, wherein each of the touch signal lines is connected to the driving circuit and a corresponding touch electrode block.

In the display panel of the present disclosure, the touch electrode layer includes: an insulating layer disposed between the compensation electrode and the touch electrode; a through hole defined by the insulating layer, wherein the touch signal line is connected to the corresponding touch electrode through the through hole.

In the display panel of the present disclosure, the touch signal line and the compensation electrode are disposed on a same layer, and the compensation electrode and the touch signal line are disposed to be insulated from each other.

In the display panel of the present disclosure, the number of the touch signal lines is the same as the number of the touch electrode blocks.

In the display panel of the present disclosure, the display panel further includes: a light-emitting layer disposed on the array substrate; a packaging layer disposed on the light-emitting layer and covering the light-emitting layer; the touch electrode layer being disposed on the packaging layer.

In the display panel of the present disclosure, the compensation electrode and the touch signal line are spaced apart and disposed on the packaging layer, and the touch electrode is disposed on the compensation electrode and the touch signal line.

In the display panel of the present disclosure, the touch electrode is disposed on the packaging layer, and the compensation electrode and the touch signal line are spaced apart and disposed on the touch electrode.

In the display panel of the present disclosure, the overlapping area of the orthographic projections of the touch electrode and the compensation electrode projected on the array substrate decreases along a direction from a side close to the driving circuit to a side away from the driving circuit.

In the display panel of the present disclosure, a first area is larger than the overlapping area, a plurality of the first areas are in a same size, the first area is a projection area of each touch electrode projected on the array substrate, and the overlapping area is a projection area of each compensation electrode projected on the array substrate.

In the display panel of the present disclosure, the display panel further includes: a cathode layer disposed between the array substrate and the touch electrode, wherein a distance between the cathode layer and the touch electrode is larger than a distance between the touch electrode and the compensation electrode.

The present disclosure further provides a display device including a display panel, in which the display panel includes: an array substrate provided with a display area and a non-display area; a driving circuit disposed on the array substrate and located in the non-display area; a touch electrode layer including a plurality of touch electrode blocks disposed in an array on the array substrate and located in the display area, wherein each of the touch electrode blocks includes a touch electrode and a compensation electrode which are disposed to be insulated from each other, the orthographic projections of the touch electrode and the compensation electrode projected on the array substrate have an overlapping area, and the overlapping area on the touch electrode block close to the driving circuit is larger than the overlapping area on the touch electrode block away from the driving circuit; a plurality of touch signal lines, wherein each of the touch signal lines is connected to the driving circuit and a corresponding touch electrode block.

In the display device of the present disclosure, the touch electrode layer includes: an insulating layer disposed between the compensation electrode and the touch electrode; a through hole defined by the insulating layer, wherein the touch signal line is connected to the corresponding touch electrode through the through hole.

In the display device of the present disclosure, the touch signal line and the compensation electrode are disposed on a same layer, and the compensation electrode and the touch signal line are disposed to be insulated from each other.

In the display device of the present disclosure, the number of the touch signal lines is the same as the number of the touch electrode blocks.

In the display device of the present disclosure, the display panel further includes: a light-emitting layer disposed on the array substrate; a packaging layer disposed on the light-emitting layer and covering the light-emitting layer; the touch electrode layer being disposed on the packaging layer.

In the display device of the present disclosure, the compensation electrode and the touch signal line are spaced apart and disposed on the packaging layer, and the touch electrode is disposed on the compensation electrode and the touch signal line.

In the display device of the present disclosure, the touch electrode is disposed on the packaging layer, and the compensation electrode and the touch signal line are spaced apart and disposed on the touch electrode.

In the display device of the present disclosure, the overlapping area of the orthographic projections of the touch electrode and the compensation electrode projected on the array substrate decreases along a direction from a side close to the driving circuit to a side away from the driving circuit.

In the display device of the present disclosure, a first area is larger than the overlapping area, a plurality of the first areas are in a same size, the first area is the projection area of each touch electrode projected on the array substrate, and the overlapping area is the projection area of each compensation electrode projected on the array substrate.

Beneficial Effect

The beneficial effect of the present disclosure is that: the compensation electrode is added on the basis of the original touch electrode of the touch electrode block, so as to change the capacitance of the touch electrode block by the overlapping area of the compensation electrode and the touch electrode on the array substrate. Since the touch electrode block close to the driving circuit has small impedance and the touch electrode block away from the driving circuit has large impedance, the impedance difference between each of the touch electrode blocks is to be within the preset range by providing the large overlapping area on the touch electrode block close to the driving circuit and the small overlapping area on the touch electrode block away from the driving circuit. As a result, the impedance difference between the touch electrode blocks in the near end and the far end is compensated, and the touch performance difference caused by the impedance of the touch signal line is improved, thereby improving the touch performance of the display panel.

DESCRIPTION OF DRAWINGS

The disclosure can be more fully understood by reading the following detailed description of the embodiments, with reference made to the accompanying drawings as follows.

DETAILED DESCRIPTION OF PREFERRED EMBODIMENTS

Figure 1:
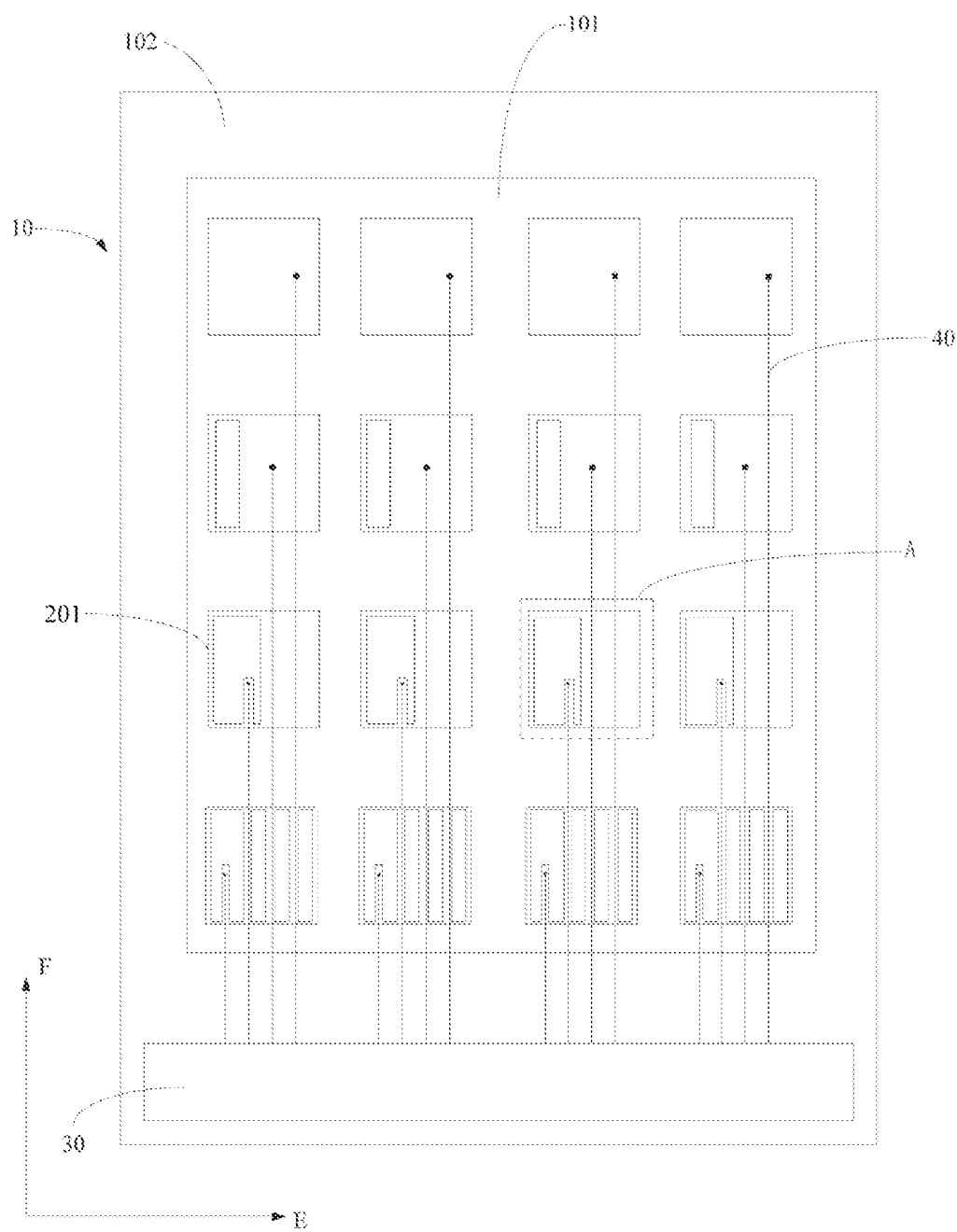
FIG. 1 is a structural schematic diagram of a display panel provided by an embodiment of the present disclosure.

The embodiments of the present disclosure are clearly and completely described below with reference to the drawings in the embodiments of the present disclosure. Obviously, the described embodiments are only a part of the embodiments of the present disclosure, but not all embodiments. All other embodiments obtained by those ordinary skilled in the art based on the embodiments of the present disclosure without creative effort are not departing from the spirit and scope of the present disclosure.

In the description of the present application, it is to be understood that terms such as "central", "longitudinal", "lateral", "length", "width", "thickness", "upper", "lower", "front", "rear", "left", "right", "vertical", "horizontal", "top", "bottom", "inner", "outer", "clockwise", "counter-clockwise" should be construed to refer to the orientation as then described or as shown in the drawings. These terms are merely for convenience and concision of description and not intended to indicate or imply that that the present disclosure be constructed or operated in a particular orientation. Accordingly, it should be understood that the present disclosure is not limited thereto. Moreover, terms such as "first" and "second" are used herein for purposes of description and are not intended to indicate or imply relative importance or significance or to imply the number of indicated technical features. Thus, the feature defined with "first" and "second" may comprise one or more of the features. In the description of the present disclosure, "a plurality of" means two or more than two, unless specified otherwise.

In the description of the present disclosure, it should be understood that, unless specified or limited otherwise, the terms "mounted", "connected", and "coupled" are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to the detail embodiment of the present disclosure.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on", "above", or "on top of" a second feature may include an embodiment in which the first feature is right or obliquely "on", "above", or "on top of" the second feature, or just means that the first feature is at a height higher than that of the second feature; while a first feature "below", "under", or "on bottom of" a second feature may include an embodiment in which the first feature is right or obliquely "below", "under", or "on bottom of" the second feature, or just means that the first feature is at a height lower than that of the second feature.

Various embodiments and examples are provided in the following description to implement different structures of the present disclosure. In order to simplify the present disclosure, certain elements and settings are described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied.

Reference is made to FIG. 1. One aspect of the present application is to provide a display panel, which includes an array substrate 10, a driving circuit 30, a plurality of touch electrode blocks 201, and a plurality of touch signal lines 40.

The array substrate 10 is provided with a display area 101 and a non-display area 102, in which the non-display area 102 surrounds the display area 101.

The driving circuit 30 is disposed at one end of the non-display area 102 to realize the touch-driving function; specifically, the driving circuit 30 is disposed along a first direction E.

Each of the plurality of touch signal lines 40 is connected with the driving circuit 30 and one of the touch electrode blocks 201. Specifically, each touch signal line 40 extends from the driving circuit 30 to one touch electrode block 201 along a second direction F.

The plurality of touch electrode blocks 201 are disposed in an array in the display area 101. Specifically, the plurality of touch electrode blocks 201 are arrayed along the first direction E and the second direction F, and the first direction E and the second direction F are perpendicular to each other. Exemplarily, the first direction E is a horizontal direction and the second direction F is a vertical direction. Each of the touch electrode blocks 201 includes a touch electrode 21 and a compensation electrode 22 which are disposed to be insulated. The orthographic projections of the touch electrode 21 and the compensation electrode 22 projected on the array substrate 10 have an overlapping area. The overlapping area on the touch electrode block 201 close to the driving circuit 30 is larger than the overlapping area on the touch electrode block 201 away from the driving circuit 30, such that the impedance difference of each of the touch electrode blocks is within a preset range, which can be set according to the actual needs, such as 0%-10%. Exemplarily, the range of the impedance difference between the touch electrode blocks 201 of each column is 5%, thereby improving the uniformity of touch of the display panel.

In a display panel and a display device provided by the present disclosure, the compensation electrode 22 is added on the basis of the original touch electrode 21 of the touch electrode block 201, so as to change the capacitance of the touch electrode block 201 by the overlapping area of the compensation electrode 22 and the touch electrode 21 on the array substrate 10. Since the touch electrode block 201 close to the driving circuit 30 has small impedance and the touch electrode block 201 away from the driving circuit 30 has large impedance, the impedance difference between each of the touch electrode blocks is to be within the preset range by providing the large overlapping area on the touch electrode block 201 close to the driving circuit 30 and the small overlapping area on the touch electrode block 201 away from the driving circuit 30. As a result, the impedance difference between the touch electrode blocks 201 in the near end and the far end is compensated and the touch performance difference caused by the impedance of the touch signal line 40 is improved, thereby improving the touch performance of the display panel.

Figure 4:
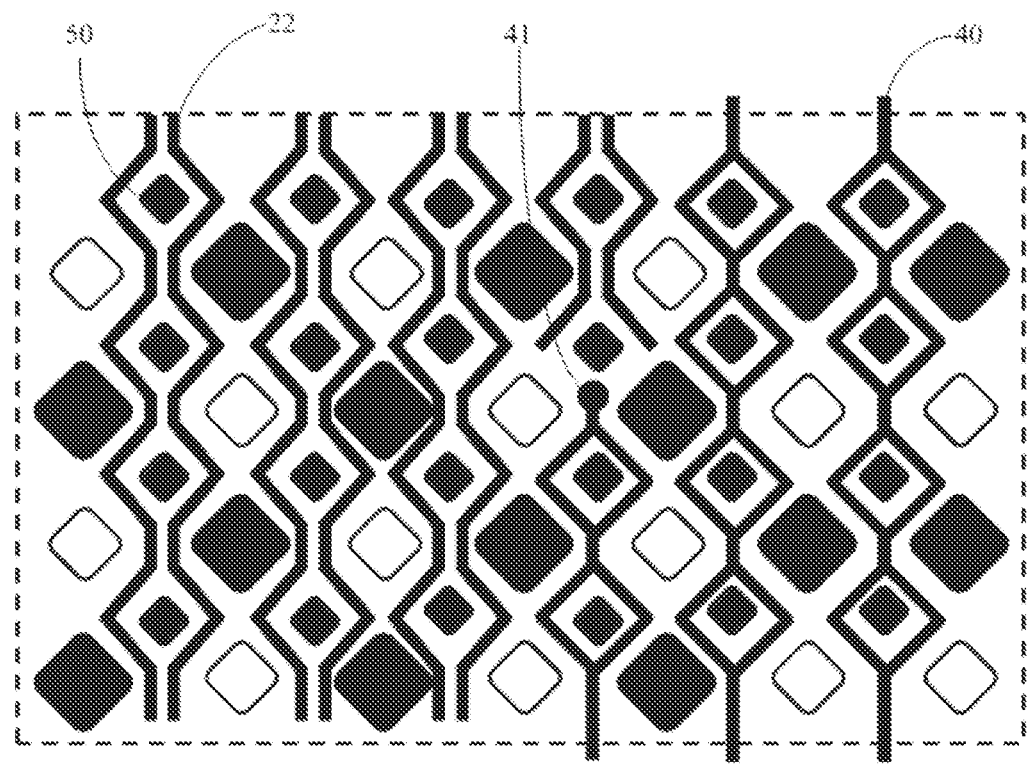
FIG. 4 is another partially-enlarged schematic diagram of A in FIG. 1 provided by an embodiment of the present disclosure.

In some embodiments, as shown in FIG. 1 in conjunction with FIG. 4, the first area is the projection area of each of the touch electrodes 21 projected on the array substrate 10. When the area of each touch electrode 21 is the same, multiple first areas are in the same size, and the first area is larger than the overlapping area, in which the overlapping area is the projection area of each compensation electrode 22 projected on the array substrate 10. The area of the touch electrode 21 is provided to remain unchanged, and the increased amount of the capacitance of the touch electrode block can be controlled by merely changing the area of the compensation capacitor, whereby facilitating the simplification for the processing on the touch electrode blocks.

In some embodiments, as shown in FIG. 1, in the direction from a side close to the driving circuit 30 to a side away from the driving circuit 30 (i.e., in the first direction F), the overlapping area of the orthographic projections of the touch electrode 21 and the compensation electrode 22 projected on the array substrate 10 decreases successively. Without adding the compensation electrodes, the impedance increases successively along the first direction F. The capacitance of the compensation capacitor is determined based on the overlapping area. The smaller the overlapping area is, the smaller capacitance the compensation capacitor has. Therefore, the compensation capacitance resulted from the compensation electrode 22 is enabled to be decreased successively along the direction F by providing the overlapping area of the orthographic projections of the touch electrode 21 and the compensation electrode 22 projected on the array substrate 10 to be decreased successively. As a result, the impedance difference between the touch electrode blocks 20 in the near end and the far end is compensated, and the touch performance difference caused by the impedance of the touch signal line 40 is improved, thereby improving the touch performance of the display panel.

Figure 3:
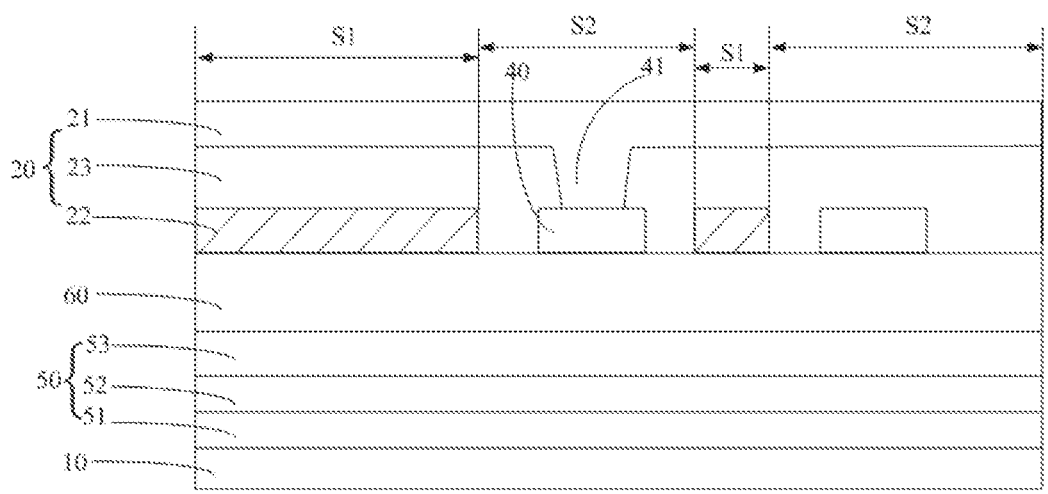
FIG. 3 is a sectional structure diagram of B-B in FIG. 2 provided by an embodiment of the present disclosure.

In some embodiments, the display panel further includes a cathode layer 53, which is disposed between the array substrate 10 and the touch electrode 21. The distance between the cathode layer 53 and the touch electrode 21 is greater than the distance between the touch electrode and the compensation electrode. Specifically, in some embodiments, as shown in FIG. 3, the display panel further includes a light-emitting layer 50, a packaging layer 60, and a touch electrode layer 20.

The light-emitting layer 50 is disposed on the array substrate 10; specifically, the light-emitting layer 50 includes an anode layer 51, an organic light-emitting layer 52, and the cathode layer 53 which are disposed in order on the array substrate 10. The anode layer 51 is disposed on the substrate, the organic light-emitting layer 52 is located on the anode, the cathode layer 53 covers the organic light-emitting layer 52, and an electric field is formed by the cathode layer 53 and the anode layer 51. The distance between the cathode layer 53 and the touch electrode 21 is greater than the distance between the touch electrode and the compensation electrode.

The capacitance of the parallel plate capacitor is given by the formula:

$$C = \frac{k \cdot S}{d}$$

where k is the dielectric constant, S is the relative area, and d is the spacing.

Figure 2:
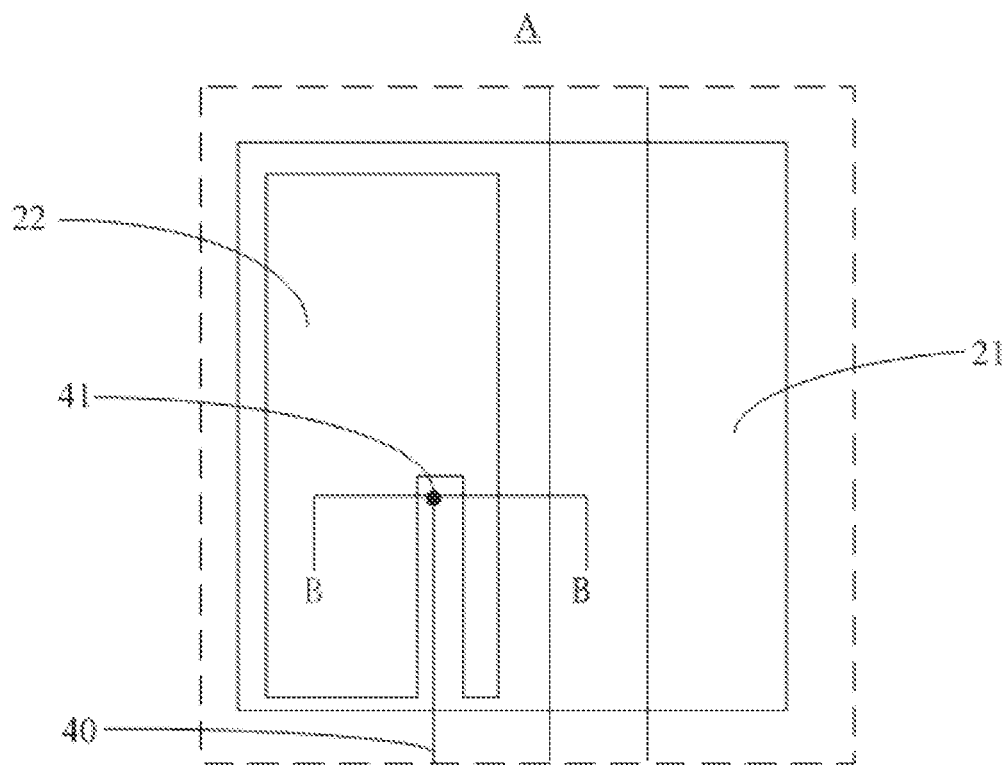
FIG. 2 is a partially-enlarged schematic diagram of A in FIG. 1 provided by an embodiment of the present disclosure.

As shown in FIG. 2 in conjunction with FIG. 3, it is supposed that the relative area between the touch electrode 21 and the compensation electrode 22, i.e., the overlapping area of the projections of the touch electrode 21 and the compensation electrode 22 projected on the array substrate 10, is defined as $S_1$, the spacing is $D_1$, then the capacitance $C_1$ is formed between the touch electrode 21 and the compensation electrode 22. It is supposed that the relative area between the touch electrode 21 and the cathode of the light-emitting layer, i.e., the area of the orthographic projection of the touch electrode 21 projected on the cathode, is defined as $S_2$, the spacing is $D_2$, then the capacitance $C_2$ is formed between the touch electrode 21 and the cathode. When $S_1 = S_2$ and $D_1 < D_2$ and, that is, the distance between the cathode layer 53 and the touch electrode 21 is greater than the distance between the touch electrode and the compensation electrode, then $C_1 > C_2$. Since $S_1 + S_2$ is fixed, $S_2$ decreases when $S_1$ increases, then $|\Delta C_1| > |\Delta C_2|$, in which $\Delta C_1$ is the increased amount of the capacitance caused by the increased $S_1$, and $\Delta C_2$ is the decreased amount of the capacitance caused by the decreased $S_2$, as a result, for the touch electrode block 201, the total capacitance is increased. Therefore, the impedance difference between the touch electrode blocks 201 in the near end and the far end can be compensated by increasing the capacitance of the touch electrode block 201, so as to improve the consistency of RC loading for the display panel, thereby improving the uniformity of the touch performance of the display panel.

The packaging layer 60 is disposed on the light-emitting layer 50 and covers the light-emitting layer 50. The touch electrode 21 and the compensation electrode 22 are disposed on the packaging layer 60.

The touch electrode layer 20 is disposed on the packaging layer 60, and the touch signal line 40 and a plurality of the touch electrode blocks 201 disposed to be insulated from each other are disposed on the touch electrode layer 20.

In some embodiments, the display panel further includes an insulating layer 23 and a through hole 41.

The insulating layer 23 is disposed between the touch electrode 21 and the compensation electrode 22. The compensation electrode 22 and the touch signal line 40 are disposed to be insulated from each other, such that the touch signal line 40 work normally without affecting the touch performance, thereby ensuring the realization of the touch function of the touch electrode 21.

Specifically, the compensation electrode 22 and the touch signal line 40 are connected and insulated from each other through the insulating layer 23. There are various ways for providing the compensation electrode 22 and the touch signal line 40 to be insulated on the touch electrode layer 20. Exemplarily, as shown in FIG. 3, the touch signal line 40 and the compensation electrode 22 are disposed on the same layer, the compensation electrode 22 and the touch signal line 40 are spaced apart and disposed on the packaging layer 60, and the touch electrode 21 is disposed on the compensation electrode 22 and the touch signal line 40.

Figure 5:
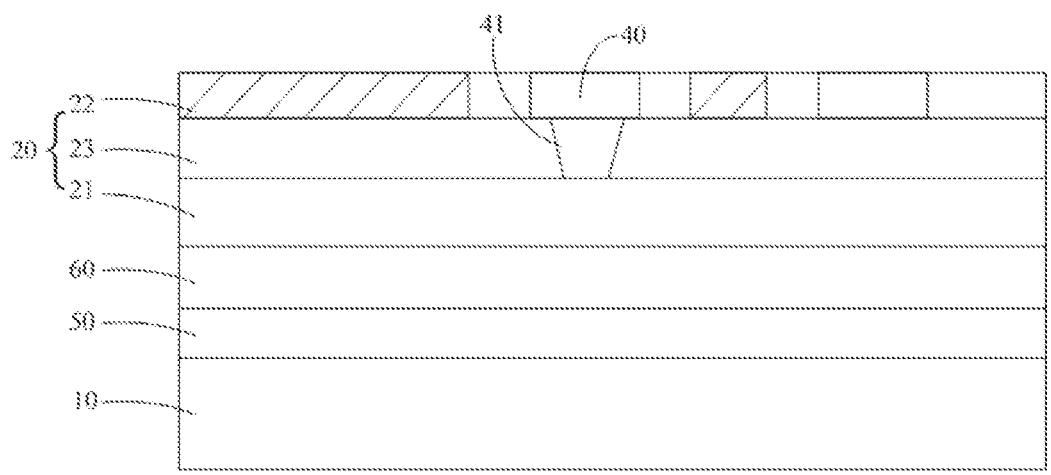
FIG. 5 is another sectional structure diagram of B-B in FIG. 2 provided by an embodiment of the present disclosure.

Certainly, there are further other ways for providing the compensation electrode 22 and the touch signal line 40. In some embodiments, as shown in FIG. 5, the touch electrode 21 is disposed on the packaging layer 60, the touch signal line 40 and the compensation electrode 22 are disposed on the same layer, and the compensation electrode 22 and the touch signal line 40 are spaced apart and disposed on the touch electrode 21. The distance between the cathode layer 53 and the touch electrode 21 is greater than the distance between the touch electrode and the compensation electrode, such that $C_1 > C_2$ when $S_1 = S_2$, thereby increasing the total capacitance. As a result, the impedance difference between the touch electrode blocks 201 in the near end and the far end can be compensated by the compensation electrode 22, so as to improve the consistency of RC loading for the display panel, thereby improving the uniformity of the touch performance of the display panel.

The touch signal line 40 and the compensation electrode 22 are disposed on the same layer. Meanwhile, the compensation electrode 22 and the touch signal line 40 being disposed on the same layer enables the film structure to be more compact.

The through hole 41 is defined by the insulating layer 23, and the touch signal line 40 is connected to the corresponding touch electrode 21 through the through hole 41. Specifically, as also shown in FIG. 2, one end of the touch signal line 40 is connected to the drive circuit 30, and the other end of the touch signal line 40 is connected to the through hole 41 on the touch electrode block 201. The touch signal line 40 being connected to the touch electrode block 201 through the through hole 41 may shorten the length of the touch signal line 40 and is advantage of further preventing the impedance of the far-end touch electrode block 201 from increasing, so as to further improve the uniformity of the touch performance.

In some embodiments, as shown in FIG. 1, the number of the touch signal lines 40 is the same as the number of the touch electrode blocks 201, such that the structure of the touch panel is compact, and no more redundant touch signal lines are increased, which is advantage of preventing the impedance of the far-end touch electrode block 201 from increasing and further improving the uniformity of the touch performance.

In some embodiments, the touch electrode 21 and the compensation electrode 22 are made of conductive oxide materials. The conductive oxide materials may be transparent conductive oxide materials, such as aluminum-doped zinc oxide (AZO) and indium zinc oxide (IZO), and may be thinner metal materials, such as Mg/Ag, Ca/Ag, Sm/Ag, Al/Ag, Ba/Ag and other composite materials. It may also be formed by non-transparent materials, such as titanium aluminum titanium (Ti/Al/Ti) and aluminum alloy. Since the touch electrode 21 is required to be patterned, the use of non-transparent materials is beneficial to avoid the sub light-emitting units to ensure the display effect.

Another aspect of the present disclosure further provides a display device, which includes the display panel. Since the display device has the aforementioned display panel, the display device has the same beneficial effect and the further description is not given herein.

The embodiment of the present disclosure has no specific restrictions on the application of the display devices, which can be any product or component with the display function, such as TVs, notebooks, tablets, wearable display devices (e.g., smart bracelets, smart watches, etc.), mobile phones, virtual reality devices, augmented reality devices, vehicle displays, and advertising light boxes.

In the aforementioned embodiments, the description of each embodiment has its own emphasis. The part not detailed in one embodiment may refer to the related description of other embodiments.

A display panel and a display device provided by the embodiment of the present disclosure are described in detail above. The principles and implementations of the present disclosure are described using specific examples in this disclosure. The description of the embodiments is merely intended to better understand the methods and core concepts of the present disclosure. Those of ordinary skill in the art should realize that the technical solutions described in the aforementioned embodiments still can be modified, or some of the technical features can be equivalently replaced; and these modifications or replacements can be made to the structure of the present disclosure without departing from the scope or spirit of the disclosure.

What is claimed is:

1. A display panel, comprising:
an array substrate provided with a display area and a non-display area;
a driving circuit disposed on the array substrate and located in the non-display area;
a touch electrode layer comprising a plurality of touch electrode blocks disposed in an array on the array substrate and located in the display area, wherein each of the touch electrode blocks comprises a touch electrode and a compensation electrode which are disposed to be insulated from each other, and the touch signal line and the compensation electrode are disposed on a same layer;
wherein the orthographic projections of the touch electrode and the compensation electrode projected on the array substrate have an overlapping area, and the overlapping area of the orthographic projections of the touch electrode and the compensation electrode projected on the array substrate decreases along a direction from a side close to the driving circuit to a side away from the driving circuit; and
a plurality of touch signal lines, wherein each of the touch signal lines is connected to the driving circuit and a corresponding touch electrode block.

2. The display panel of claim 1, wherein the display panel further comprises:
a cathode layer disposed between the array substrate and the touch electrode, wherein a distance between the cathode layer and the touch electrode is larger than a distance between the touch electrode and the compensation electrode.

3. A display panel, comprising:
an array substrate provided with a display area and a non-display area;
a driving circuit disposed on the array substrate and located in the non-display area;
a touch electrode layer comprising a plurality of touch electrode blocks disposed in an array on the array substrate and located in the display area, wherein each of the touch electrode blocks comprises a touch electrode and a compensation electrode which are disposed to be insulated from each other, the orthographic projections of the touch electrode and the compensation electrode projected on the array substrate have an overlapping area, and the overlapping area on the touch electrode block close to the driving circuit is larger than the overlapping area on the touch electrode block away from the driving circuit; and
a plurality of touch signal lines, wherein each of the touch signal lines is connected to the driving circuit and a corresponding touch electrode block.

4. The display panel of claim 3, wherein the touch electrode layer comprises:
an insulating layer disposed between the compensation electrode and the touch electrode; and
a through hole defined by the insulating layer, wherein the touch signal line is connected to the corresponding touch electrode through the through hole.

5. The display panel of claim 4, wherein the touch signal line and the compensation electrode are disposed on a same layer, and the compensation electrode and the touch signal line are disposed to be insulated from each other.

6. The display panel of claim 4, wherein a number of the touch signal lines is the same as a number of the touch electrode blocks.

7. The display panel of claim 4, wherein the display panel further comprises:
a light-emitting layer disposed on the array substrate;
a packaging layer disposed on the light-emitting layer and covering the light-emitting layer; and
the touch electrode layer being disposed on the packaging layer.

8. The display panel of claim 7, wherein the compensation electrode and the touch signal line are spaced apart and disposed on the packaging layer, and the touch electrode is disposed on the compensation electrode and the touch signal line.

9. The display panel of claim 7, wherein the touch electrode is disposed on the packaging layer, and the compensation electrode and the touch signal line are spaced apart and disposed on the touch electrode.

10. The display panel of claim 3, wherein the overlapping area of the orthographic projections of the touch electrode and the compensation electrode projected on the array substrate decreases along a direction from a side close to the driving circuit to a side away from the driving circuit.

11. The display panel of claim 3, wherein a first area is larger than the overlapping area, a plurality of the first areas are in a same size, the first area is a projection area of each touch electrode projected on the array substrate, and the overlapping area is a projection area of each compensation electrode projected on the array substrate.

12. A display device comprising a display panel, wherein the display panel comprises:

an array substrate provided with a display area and a non-display area;

a driving circuit disposed on the array substrate and located in the non-display area;

a touch electrode layer comprising a plurality of touch electrode blocks disposed in an array on the array substrate and located in the display area, wherein each of the touch electrode blocks comprises a touch electrode and a compensation electrode which are disposed to be insulated from each other, the orthographic projections of the touch electrode and the compensation electrode projected on the array substrate have an overlapping area, and the overlapping area on the touch electrode block close to the driving circuit is larger than the overlapping area on the touch electrode block away from the driving circuit; and a plurality of touch signal lines, wherein each of the touch signal lines is connected to the driving circuit and a corresponding touch electrode block.

13. The display device of claim 12, wherein the touch electrode layer comprises:

an insulating layer disposed between the compensation electrode and the touch electrode; and a through hole defined by the insulating layer, wherein the touch signal line is connected to the corresponding touch electrode through the through hole.

14. The display device of claim 13, wherein the touch signal line and the compensation electrode are disposed on a same layer, and the compensation electrode and the touch signal line are disposed to be insulated from each other.

15. The display device of claim 13, wherein a number of the touch signal lines is the same as a number of the touch electrode blocks.

16. The display device of claim 13, wherein the display panel further comprises:

a light-emitting layer disposed on the array substrate;

a packaging layer disposed on the light-emitting layer and covering the light-emitting layer; and the touch electrode layer being disposed on the packaging layer.

17. The display device of claim 16, wherein the compensation electrode and the touch signal line are spaced apart and disposed on the packaging layer, and the touch electrode is disposed on the compensation electrode and the touch signal line.

18. The display device of claim 16, wherein the touch electrode is disposed on the packaging layer, and the compensation electrode and the touch signal line are spaced apart and disposed on the touch electrode.

19. The display device of claim 12, wherein the overlapping area of the orthographic projections of the touch electrode and the compensation electrode projected on the array substrate decreases along a direction from a side close to the driving circuit to a side away from the driving circuit.

20. The display device of claim 12, wherein a first area is larger than the overlapping area, a plurality of the first areas are in a same size, the first area is the projection area of each touch electrode projected on the array substrate, and the overlapping area is the projection area of each compensation electrode projected on the array substrate.

* * * * *